United States Patent
Nishikawa et al.

(10) Patent No.: US 7,611,745 B2
(45) Date of Patent: *Nov. 3, 2009

(54) LASER REPAIRING METHOD OF ELECTROLUMINESCENT DISPLAY DEVICE

(75) Inventors: Ryuji Nishikawa, Gifu (JP); Ryozo Nagata, Bisai (JP); Takashi Ogawa, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 741 days.

This patent is subject to a terminal disclaimer.

(21) Appl. No.: 10/758,598

(22) Filed: Jan. 16, 2004

(65) Prior Publication Data

US 2004/0202777 A1    Oct. 14, 2004

(30) Foreign Application Priority Data

Jan. 21, 2003    (JP) ............... 2003-012381

(51) Int. Cl.
- *B05D 5/06* (2006.01)
- *B05D 3/00* (2006.01)
- *B32B 43/00* (2006.01)
- *C08J 7/18* (2006.01)
- *H01J 9/50* (2006.01)

(52) U.S. Cl. ............ 427/66; 427/140; 427/554; 445/2

(58) Field of Classification Search ............ 427/66, 427/140, 554–556; 445/3, 2
See application file for complete search history.

(56) References Cited

U.S. PATENT DOCUMENTS

| | | | |
|---|---|---|---|
| 4,624,736 A * | 11/1986 | Gee et al. ............ 216/65 |
| 5,792,561 A | 8/1998 | Whang et al. | |
| 6,219,113 B1 * | 4/2001 | Takahara ............ 349/42 |
| 6,573,650 B2 | 6/2003 | Aoki et al. | |
| 6,628,355 B1 | 9/2003 | Takahara | |
| 6,650,047 B2 | 11/2003 | Aoki et al. | |
| 6,747,728 B2 | 6/2004 | Nagayama | |
| 6,778,233 B2 | 8/2004 | Matsuura et al. | |
| 6,909,111 B2 | 6/2005 | Yamagata et al. | |
| 2002/0063844 A1 * | 5/2002 | Matsuura et al. ........ 349/187 |
| 2002/0142697 A1 * | 10/2002 | Yamagata et al. ........ 445/24 |
| 2003/0222861 A1 * | 12/2003 | Nishikawa et al. ...... 345/204 |
| 2005/0078235 A1 * | 4/2005 | Ozaki et al. ............ 349/55 |
| 2005/0196892 A1 | 9/2005 | Yamagata et al. | |

FOREIGN PATENT DOCUMENTS

| | | | |
|---|---|---|---|
| JP | 2000-195677 | * | 7/2000 |
| JP | 2002-144057 | | 5/2002 |
| JP | 2002-260857 | | 9/2002 |
| JP | 2003-178871 | * | 6/2003 |

* cited by examiner

Primary Examiner—Timothy H Meeks
Assistant Examiner—Jimmy Lin
(74) Attorney, Agent, or Firm—Morrison & Forester LLP

(57) ABSTRACT

The invention is directed to repairing of a defective portion caused by a short circuit without generating a dark spot by a pin hole. Laser beams are irradiated to an irradiating region set in a peripheral region of a foreign substance. This prevents damaging of an organic EL element which the foreign substance adheres to and formation of the pin hole. By irradiating laser beams to the peripheral region at a distance from the foreign substance, energy of the laser beams spreads concentrically around the irradiating region, and is also supplied to the foreign substance indirectly. Therefore, the high resistive region can be formed between an anode layer and a cathode layer so that the defective portion caused by the short circuit by the foreign substance can be repaired.

7 Claims, 4 Drawing Sheets

US 7,611,745 B2

LASER REPAIRING METHOD OF ELECTROLUMINESCENT DISPLAY DEVICE

BACKGROUND OF THE INVENTION

1. Field of the Invention

The invention relates to a laser repairing method of an electroluminescent display device having a plurality of pixels and an electroluminescent element provided in each of the pixels and formed by interposing an electroluminescent layer between an anode layer and a cathode layer.

2. Description of the Related Art

An organic electroluminescent (hereafter, referred to as EL) display device using organic EL elements is receiving an attention as a new display device substituted for a CRT or an LCD.

FIG. 5 is a cross-sectional view showing a structure of such an organic EL element. An anode layer 1 made of ITO (indium tin oxide) is formed on a transparent insulating substrate 10 such as a glass substrate, and an organic EL layer formed of a hole transport layer 2, an emissive layer 3, and an electron transport layer 4 is laminated thereon. A cathode layer 5 is formed on this organic EL layer. A potential difference is applied between the anode layer 1 and the cathode layer 5. When a drive current flows in the organic EL element, a hole injected from the anode layer 1 and an electron injected from the cathode layer 5 are recombined in the emissive layer 3, and an organic molecule forming the emissive layer 3 is excited to form an exciton. Light is emitted from the emissive layer 3 in a process of radiation of the exciton and then released outside after going through the transparent anode layer 1 to the transparent insulating substrate 10, thereby completing light-emission.

The above organic EL layer and the cathode layer 5 are formed by a vapor deposition method using a metal mask. In this vapor deposition process, a foreign substance 6 sometimes adheres to a region for the formation of the organic EL element. This generates a short circuit between the anode layer 1 and the cathode layer 5 so that a potential difference disappears between the anode layer 1 and the cathode layer 5. Then, the drive current does not flow in the organic EL element, and a so-called dark spot occurs in this pixel region.

To solve this problem, laser beams having a predetermined wavelength (for example, 1056 nm) are radiated to the foreign substance 6 to burn it out. This enables normal light-emission at a peripheral pixel region except the pixel irradiated with the laser beams.

However, when the laser beams are not properly radiated to the foreign substance 6, the cathode layer 5 is damaged by the energy of the laser beams and can be torn to form a pin hole at the organic EL element. Once the pin hole is formed, moisture enters the organic EL element therefrom to damage the element, resulting in a display defect of a dark spot.

SUMMARY OF THE INVENTION

The invention provides a method of repairing an electroluminescent display panel using laser. The method includes providing a panel to be assembled into an electroluminescent display device. The panel includes a plurality of pixels each including an electroluminescent element having an electroluminescent layer formed between an anode layer and a cathode layer. The method also includes detecting a foreign substance adhering to the electroluminescent element, and irradiating with a laser beam a region of the display panel that is away from the foreign substance so that a high resistivity region is formed between the anode layer and the cathode layer and around the foreign substance.

DETAILED DESCRIPTION OF THE INVENTION

Figure 1:
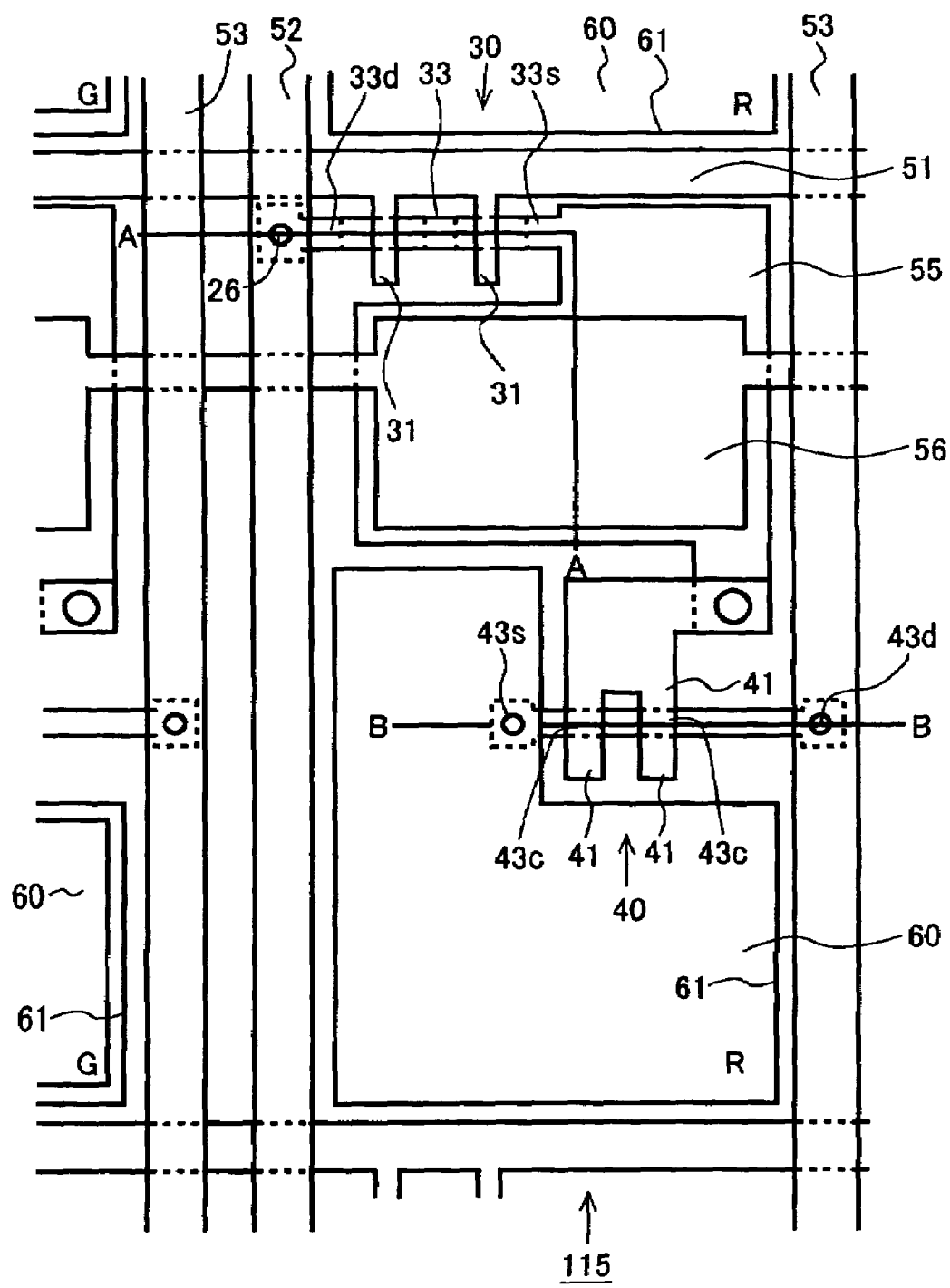
FIG. 1 is a plan view of an EL display device of an embodiment of the invention.
Figure 2A:
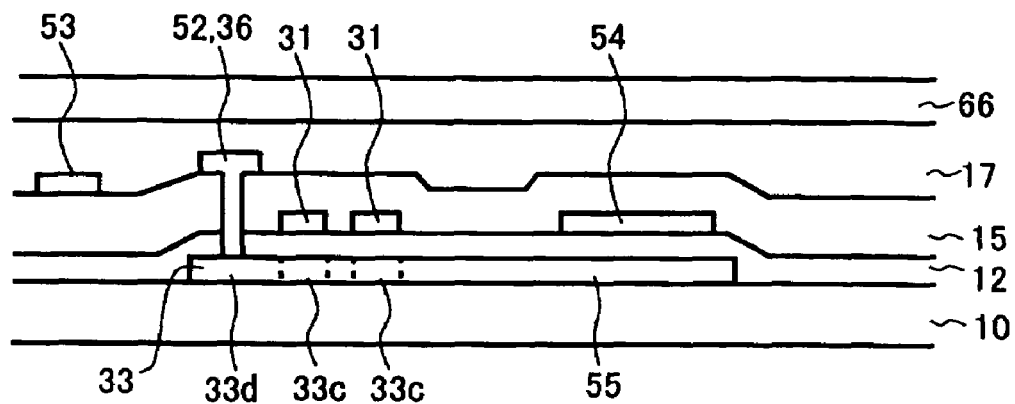
FIGS. 2A and 2B are cross-sectional views of the EL display device of FIG. 1.

An embodiment of the invention will be described with reference to the drawings in detail. An organic EL display device of this embodiment will be described first. FIG. 1 is a plan view showing a pixel of the organic EL display device. FIG. 2A is a cross-sectional view along line A-A of FIG. 1, and FIG. 2B is a cross-sectional view along line B-B of FIG. 1.

Figure 2B:
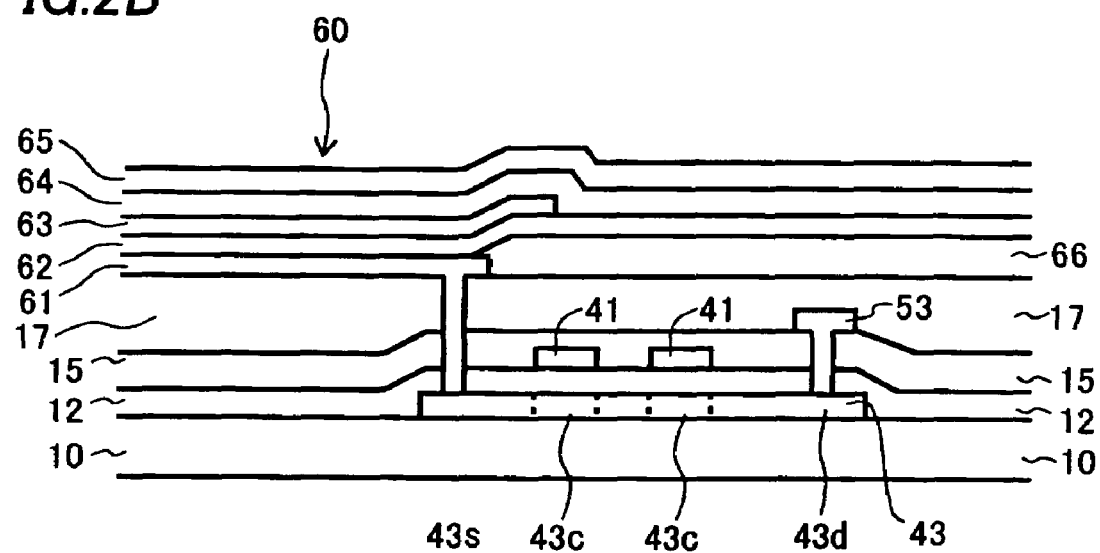

As shown in FIGS. 1, 2A, and 2B, a pixel 115 is formed in a region enclosed with a gate signal line 51 and a drain signal line 52. A plurality of the pixels 115 is arranged in a matrix configuration.

An organic EL element 60 as a self-emissive element, a switching TFT (thin film transistor) 30 for controlling a timing of supplying an electric current to the organic EL element 60, an organic EL element driving TFT 40 for supplying an electric current to the organic EL element 60, and a storage capacitor 56 are disposed in the pixel 115.

The switching TFT 30 is provided on a periphery of the intersection of the signal lines 51 and 52. A source 33s of the switching TFT 30 serves as a capacitor electrode 55 for forming a capacitor with a storage capacitor electrode line 54 and is connected with a gate electrode 41 of the organic EL element driving TFT 40. A source 43s of the organic EL element driving TFT 40 is connected with the anode layer 61 of the organic EL element 60, while a drain 43d is connected with a driving source line 53 as a current source for the organic EL element 60.

The storage capacitor electrode line 54 is placed in parallel with the gate signal line 51. The storage capacitor electrode line 54 is made of Cr (chromium) and so on and forms a capacitor by storing an electric charge with the capacitor electrode 55 connected to the source 33s of the TFT 30 through a gate insulating film 12. The storage capacitor 56 is provided for storing voltage applied to the gate electrode 41 of the organic EL element driving TFT 40.

The organic EL display device is formed by laminating the TFTs and the organic EL element sequentially on a substrate 10, such as a substrate made of a glass or a synthetic resin, a substrate having conductivity, or a semiconductor substrate. When using a substrate having conductivity or a semiconductor substrate as the substrate 10, however, an insulating film made of $SiO_2$ or $SiN_x$ is formed on the substrate 10, and then the switching TFT 30, the organic EL element driving TFT 40 and the organic EL element 60 are formed thereon. Each of the TFTs 30 and 40 has a so-called top gate structure in which a gate electrode is placed above an active layer with a gate insulating film being interposed therebetween.

The structure of the switching TFT 30 will be described first.

As shown in FIG. 2A, an amorphous silicon film (hereafter, referred to as an a-Si film) is formed on the insulating substrate 10 made of silica glass or a non-alkali glass by a CVD method and so on. The a-Si film is irradiated with laser beams for melting and recrystallizing to form a poly-silicon film (hereafter, referred to as a p-Si film) as an active layer 33. On the active layer 33, a single-layer or a multi-layer having an $SiO_2$ film and an $SiN_x$ film is formed as the gate insulating film 12. There are formed on the gate insulating film 12 the gate signal line 51 made of a metal having a high melting point, such as Cr or Mo (molybdenum), and also serving as a gate electrode 31, the drain signal line 52 made of Al (aluminum), and the driving source line 53 made of Al and serving as a driving source of the organic EL element 60.

An interlayer insulating film 15 formed by laminating an $SiO_2$ film, an $SiN_x$ film and an $SiO_2$ film covers the whole surfaces of the gate insulating film 12 and the active layer 33. A drain electrode 36 is provided by filling a contact hole provided above the drain 33*d* with a metal such as Al. Furthermore, a first planarization insulating film 17 for planarizing a surface, which is made of an organic resin, is formed on the whole surface.

Next, the structure of the organic EL element driving TFT 40 will be described. As shown in FIG. 2B, an active layer 43 formed by poly-crystallizing an a-Si film by irradiating the film by laser beams, the gate insulating film 12, and the gate electrode 41 made of a metal having a high melting point, such as Cr or Mo, are formed sequentially on the insulating substrate 10 made of silica glass, or a non-alkali glass. A channel 43*c*, a source 43*s*, and a drain 43*d* are provided in the active layer 43. The source 43*s* and the drain 43*d* are placed on both sides of the channel 43*c*.

The interlayer insulating film 15 having the $SiO_2$ film, the $SiN_x$ film and the $SiO_2$ film is formed on the whole surfaces of the gate insulating film 12 and the active layer 43. The driving source line 53 is connected to a driving source by a contact hole filled with a metal such as Al provided on the drain 43*d*. Furthermore, a planarization insulating film 17 for planarizing the surface, which is made of, for example, an organic resin is formed on the whole surface. A contact hole is formed in a position corresponding to a source 43*s* in the planarization insulating film 17. A transparent electrode made of ITO and being in contact with the source 43*s* through the contact hole, i.e., the anode layer 61 of the organic EL element, is formed on the planarization insulating film 17. The anode layer 61 is formed in each of the pixels as an isolated island.

The organic EL element 60 has a structure of laminating sequentially the anode layer 61 made of a transparent electrode such as ITO, a hole transport layer 62 including a first hole transport layer made of MTDATA (4,4-bis(3-methylphenylphenylamino)biphenyl) and a second hole transport layer made of TPD (4,4,4-tris(3-methylphenylphenylamino) triphenylamine), an emissive layer 63 made of Bebq2 (bis(10-hydroxybenzo[h]quinolinato)beryllium) containing a quinacridone derivative, an electron transport layer 64 made of Bebq2 and a cathode layer 65 made of magnesium-indium alloy, Al or Al alloy.

A second planarization insulating film 66 is formed on the planarization insulating film 17. This second planarization insulating film 66 is patterned to expose the anode layer 61.

In the organic EL element 60, a hole injected from the anode layer 61 and an electron injected from the cathode layer 65 are recombined in the emissive layer 63, and an exciton is formed by exciting an organic module forming the emissive layer 63. Light is emitted from the emissive layer 63 in a process of radiation of the exciton and then released outside after going through the transparent anode layer 61 to the transparent insulating substrate 10, thereby completing light-emission.

Figure 3:
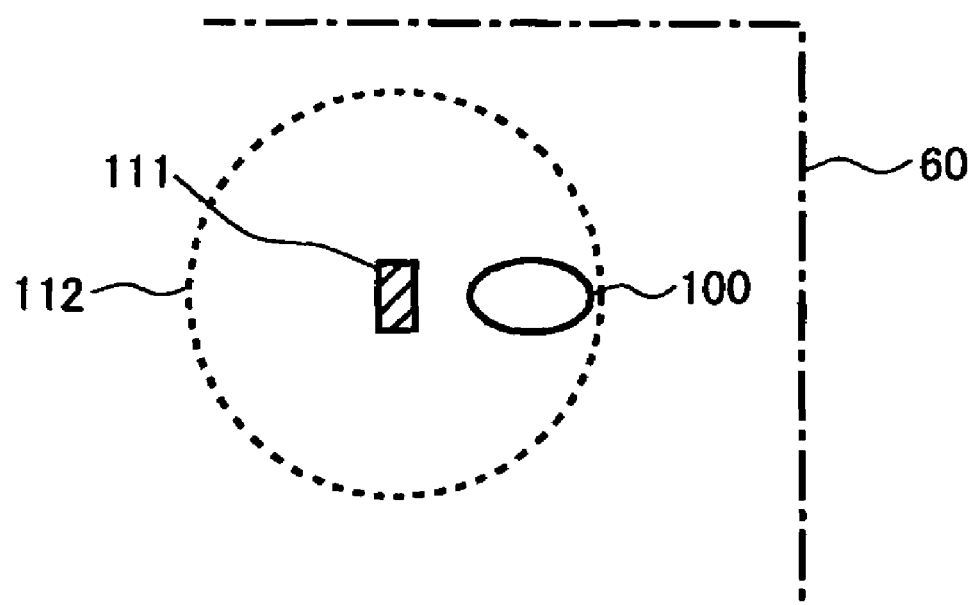
FIG. 3 is a plan view showing a positioning of a laser beam of a repairing method of the EL display device of FIG. 1.
Figure 6:
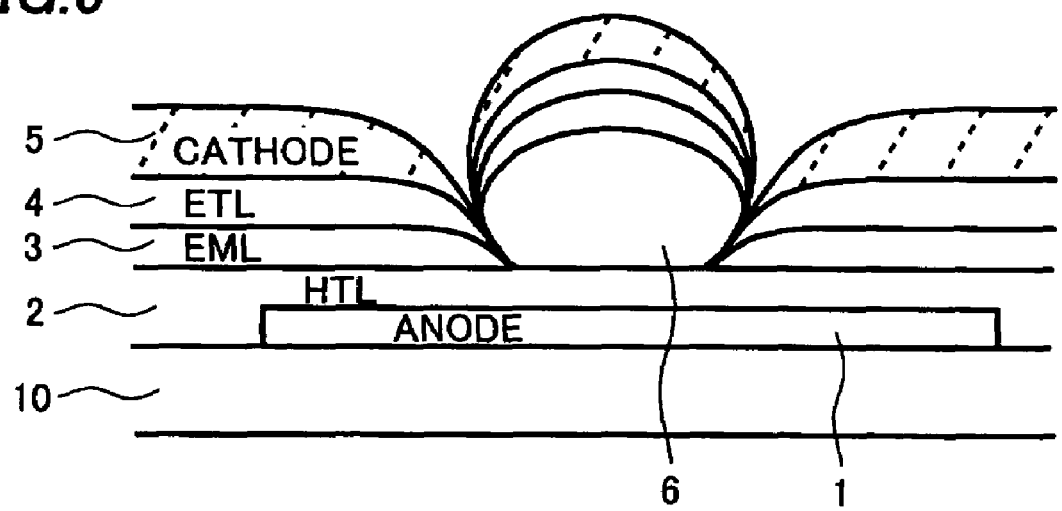
FIG. 6 shows a foreign substance adhering to the organic EL element of FIG. 5.

Next, a laser repairing method of the above described organic EL display device will be described. As shown in FIG. 3, a foreign substance 100 is now detected adhering to the organic EL element 60 of one pixel. A cross-section of the structure shown in FIG. 3 is similar to that shown in FIG. 6. As a method of detecting a foreign substance, for example, visual observation using a microscope or an automatic detecting method by a foreign substance detecting device can be employed.

In the repairing method of this embodiment, laser beams are configured not to directly incident on the foreign substance 100, but to be incident on an irradiation region 111 near the foreign substance 100. This prevents the organic EL element 60 having the foreign substance 100 from being damaged and thus prevents a pin hole formation. By irradiating with the laser beams the irradiation region 111 at a predetermined distance from the foreign substance 100, the energy of the laser beams spreads concentrically from the irradiating region 111, i.e., the laser beams do not hit the foreign substance 100 directly. Accordingly, the laser energy is supplied to the foreign substance 100 indirectly. This spread of the laser energy forms a high resistivity region 112, shown in FIG. 3, between the anode layer 61 and the cathode layer 65 so that a defective portion caused by a short circuit by the foreign substance 100 can be repaired. This high resistivity region 112 is formed because the hole transport layer 2, the emissive layer 3 and the electron transport layer 4 in this region 112 are melted together by thermal energy of the laser beams and thus the layered structure thereof disappears.

Here, a commercially available YAG laser (for example, having a laser wavelength of 355 nm) can be used as the laser source. The size of the irradiating region 111 is 5 μm by 5 μm, for example. The size of the foreign substance 100 is 0.3 μm to 10 μm. It is preferable to set the irradiation region 111 at a distance of 5 μm to 10 μm from the foreign substance 100.

Figure 4:
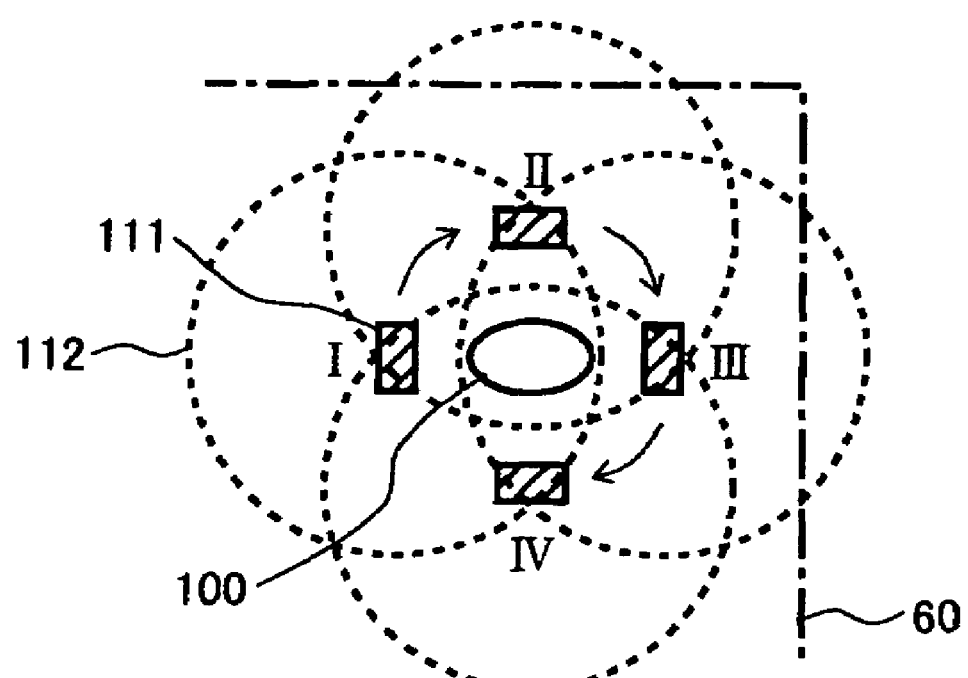
FIG. 4 is a plan view showing a multiple positioning of a laser beam of a repairing method of the EL display device of FIG. 1.
Figure 5:
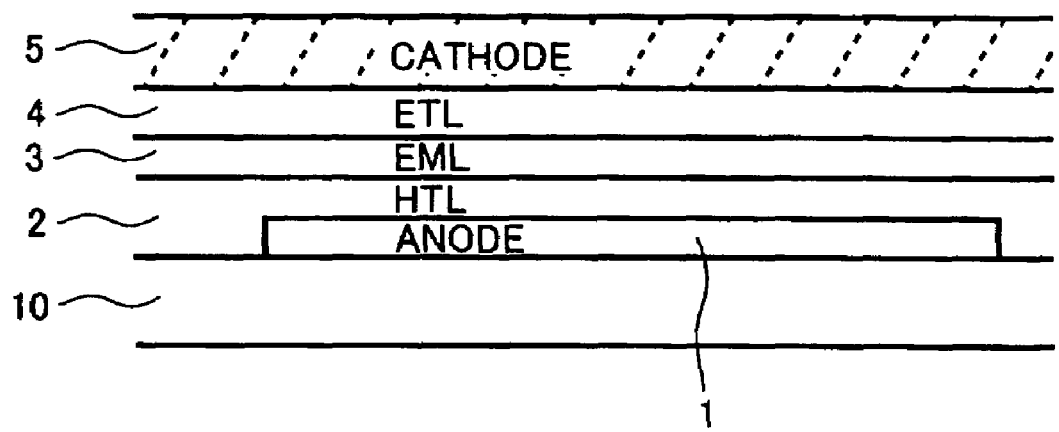
FIG. 5 is a cross-sectional view of a conventional organic EL element.

When the size of the foreign substance 100 is 3 μm or more, it is preferable to supply a large amount of energy to the irradiation region 111 by positioning the laser beams to four different peripheral regions of the foreign substance 100, that is, a left side, an upper side, a right side and a lower side (I to IV in FIG. 4) of the foreign substance 100, as shown in FIG. 4. The number of the multiple irradiation can be increased or decreased as appropriate based on the size of the foreign substance 100.

In this embodiment, the laser beams having a wavelength of 532 nm or lower can repair the defective portion without damaging the organic EL element.

What is claimed is:

1. A method of repairing an electroluminescent display panel using laser, comprising:

providing a panel to be assembled into an electroluminescent display device, the panel comprising a plurality of pixels each including an electroluminescent element having an electroluminescent layer formed between an anode layer and a cathode layer;

detecting a foreign substance adhering to the electroluminescent element; and irradiating with a laser beam a region of the display panel that is away from the foreign substance so that a high resistivity region is formed as a result of a melting by the laser beam of the electroluminescent layer between the anode layer and the cathode layer and around the foreign substance, wherein the laser beam is not directly incident on the detected foreign substance but the energy that spreads concentrically from the laser beam is irradiated on the foreign substance such that the laser energy is supplied to the foreign substance indirectly, the electroluminescent layer comprises a layered structure of a hole transport layer, an emissive layer and an electron transport layer, and during the melting of the electroluminescent layer the hole transport layer, the emissive layer and the electron transport layer are melted together so that the layered structure disappears and the high resistivity region comprising melted constituents of the hole transport layer, the emissive layer and the electron transport layer is formed between the anode layer and the cathode layer, and at the portion of the electroluminescent element on which the laser beam is incident, the anode layer and the cathode do not lose a layer structure thereof and remain on and below the melted constituents.

2. The method of claim 1, wherein the laser beam irradiation is repeated a plurality of times so that a plurality regions of the display panel around the foreign substance is irradiated.

3. The method of claim 2, wherein a wavelength of the laser beam is 532 nm or lower.

4. The method of claim 2, wherein the irradiated region of the display panel is away from the foreign substance by a distance between 5 μm and 10 μm.

5. The method of claim 1, wherein a wavelength of the laser beam is 532 nm or lower.

6. The method of claim 1, wherein the irradiated region of the display panel is away from the foreign substance by a distance between 5 μm and 10 μm.

7. The method of claim 1, wherein the irradiation with the laser beam is performed so that the high resistivity region is in contact with an entire lateral edge of the foreign substance.

* * * * *